United States Patent
Chang et al.

(10) Patent No.: US 10,574,263 B2
(45) Date of Patent: Feb. 25, 2020

(54) METHOD FOR IMPLEMENTING TURBO EQUALIZATION COMPENSATION, TURBO EQUALIZER AND SYSTEM

(71) Applicant: HUAWEI TECHNOLOGIES CO., LTD., Shenzhen (CN)

(72) Inventors: Deyuan Chang, Shenzhen (CN); Zhiyu Xiao, Chengdu (CN); Fan Yu, Chengdu (CN); Yu Zhao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 169 days.

(21) Appl. No.: 14/984,351

(22) Filed: Dec. 30, 2015

(65) Prior Publication Data

US 2016/0112065 A1    Apr. 21, 2016

Related U.S. Application Data

(63) Continuation of application No. PCT/CN2013/078570, filed on Jul. 1, 2013.

(51) Int. Cl.
*H03M 13/11* (2006.01)
*H03M 13/29* (2006.01)
(Continued)

(52) U.S. Cl.
CPC ... *H03M 13/1154* (2013.01); *H03M 13/2957* (2013.01); *H03M 13/2987* (2013.01);
(Continued)

(58) Field of Classification Search
CPC ......... H03M 13/1154; H03M 13/2957; H03M 13/2987; H03M 13/3746; H03M 13/3972;
(Continued)

(56) References Cited

U.S. PATENT DOCUMENTS 5,461,644 A * 10/1995 Bergmans ............. H03M 13/41
                                                          375/341
8,006,163 B2    8/2011 Djordjevic et al.
(Continued)

FOREIGN PATENT DOCUMENTS

CN    101060481 A    10/2007
CN    101321043 A    12/2008
(Continued)

OTHER PUBLICATIONS

IEEE 100, The authoritative Dictionary of IEEE Standards Terms, Seventh Edition, IEEE Standards, pp. 238, 563, 683, 771 (Year: 2000).*

(Continued)

*Primary Examiner* — April Y Blair
*Assistant Examiner* — Dipakkumar B Gandhi
(74) *Attorney, Agent, or Firm* — Staas & Halsey LLP

(57) ABSTRACT

Embodiments of the present application relate to a method for implementing Turbo equalization compensation. The equalizer divides a first data block into n data segments, where D bits in two adjacent data segments in the n data segments overlap, performs recursive processing on each data segment in the n data segments, before the recursive processing, merges the n data segments to obtain a second data block; and performs iterative decoding on the second data block, to output a third data block, where data lengths of the first data block, the second data block, and the third data block are all 1/T of a code length of a LDPC convolutional code.

7 Claims, 8 Drawing Sheets

(51) Int. Cl.

| | | |
|---|---|---|
| *H03M 13/00* | (2006.01) | |
| *H03M 13/39* | (2006.01) | |
| *H04L 1/00* | (2006.01) | |
| *H04B 10/61* | (2013.01) | |
| *H04B 10/2569* | (2013.01) | |
| *H04B 10/2507* | (2013.01) | |
| *H04B 10/2543* | (2013.01) | |
| *H04L 25/03* | (2006.01) | |
| *H03M 13/37* | (2006.01) | |
| *H03M 13/53* | (2006.01) | |
| *H04L 25/02* | (2006.01) | |

(52) U.S. Cl.
CPC ... *H03M 13/3746* (2013.01); *H03M 13/3972* (2013.01); *H03M 13/616* (2013.01); *H03M 13/6331* (2013.01); *H03M 13/6561* (2013.01); *H04B 10/2543* (2013.01); *H04B 10/2569* (2013.01); *H04B 10/25073* (2013.01); *H04B 10/6161* (2013.01); *H04B 10/6162* (2013.01); *H04L 1/0045* (2013.01); *H04L 1/0057* (2013.01); *H04L 25/03057* (2013.01); *H04L 25/03171* (2013.01); *H04L 25/0202* (2013.01); *H04L 2025/03789* (2013.01)

(58) Field of Classification Search
CPC ........... H03M 13/616; H03M 13/6331; H03M 13/6561; H04B 10/25; H04L 1/00; H04L 1/0045; H04L 1/0057; H04L 25/03; H04L 25/03057; H04L 2025/03789
See application file for complete search history.

(56) References Cited

U.S. PATENT DOCUMENTS

| | | | |
|---|---|---|---|
| 8,185,796 B2 | 5/2012 | Djordjevic et al. | |
| 8,924,811 B1* | 12/2014 | Ghosh | H03M 13/3905 714/755 |
| 2002/0123851 A1* | 9/2002 | Kurooka | H04B 10/2513 702/69 |
| 2002/0174401 A1* | 11/2002 | Wang | H03M 13/3905 714/786 |
| 2003/0099018 A1* | 5/2003 | Singh | B82Y 20/00 398/82 |
| 2004/0213338 A1* | 10/2004 | Strawczynski | H04B 10/077 375/224 |
| 2009/0172495 A1 | 7/2009 | Wang et al. | |
| 2009/0259915 A1* | 10/2009 | Livshitz | H03M 13/1111 714/758 |
| 2012/0331369 A1* | 12/2012 | Li | H03M 13/033 714/758 |
| 2013/0132803 A1 | 5/2013 | Xiao et al. | |

FOREIGN PATENT DOCUMENTS

| | | |
|---|---|---|
| CN | 101442321 A | 5/2009 |
| CN | 101951266 A | 1/2011 |
| CN | 102340320 A | 2/2012 |
| CN | 102687445 A | 9/2012 |
| EP | 2 790 327 A1 | 10/2014 |

OTHER PUBLICATIONS

International Search Report dated Apr. 3, 2014 in corresponding International Patent Application No. PCT/CN2013/078570.
Chinese Search Report dated Aug. 12, 2015 in corresponding Chinese Patent Application No. 2013800011599.
Chinese Office Action dated Aug. 24, 2015 in corresponding Chinese Patent Application No. 201380001159.9.
Yoon et al., "A Parallel MAP Algorithm for Low Latency Turbo Decoding", IEEE Communications Letters, vol. 6, No. 7, IEEE, Jul. 2002, pp. 288-290.
Hsu et al., "A Parallel Decoding Scheme for Turbo Codes", IEEE, 1998, pp. 445-448.
Djordjevic et al., "PMD Compensation by LDPC-Coded Turbo Equalization", IEEE Photonics Technology Letter, vol. 19, No. 15, IEEE, Aug. 1, 2007, pp. 1163-1165.
Iyengar et al., "Windowed Decoding of Protograph-Based LDPC Convolutional Codes Over Erasure Channels", IEEE Transactions on Information Theory, vol. 58, No. 4, IEEE, Apr. 2012, pp. 2303-2320.
Sauer-Greff et al., "Iterative Equalization and FEC Decoding in Optical Communication Systems; Concepts and Performance", OFC/NFOEC, IEEE, 2008, 3 pages.
Hassan et al., "Comparison of LDPC Block and LDPC Convolutional Codes Based in their Decoding Latency", 2012 7th International Symposium on Turbo Codes and Interactive Information Processing (ISTC), IEEE, 2012, pp. 225-229.
Hu, Xiao-Yu, "Low-Delay Low-Complexity Error-Correcting Codes on Sparse Graphs", Master Thesis 2681, 2003, 177 pages.
Extended European Search Report dated Jul. 13, 2016 in corresponding European Patent Application No. 13888637.9.
International Search Report dated Apr. 3, 2014, in corresponding International Application No. PCT/CN2013/078570.

* cited by examiner

METHOD FOR IMPLEMENTING TURBO EQUALIZATION COMPENSATION, TURBO EQUALIZER AND SYSTEM

CROSS-REFERENCE TO RELATED APPLICATIONS

This application is a continuation of International Application No. PCT/CN2013/078570, filed on Jul. 1, 2013, which is hereby incorporated by reference in its entirety.

TECHNICAL FIELD

Embodiments of the present disclosure relate to the field of optical communications, and in particular, to a method for implementing Turbo equalization compensation, a Turbo equalizer and a Turbo equalizer system.

BACKGROUND

Currently, a transmission rate in a high-speed optical fiber transmission system has been increased, for example, from 40 Gbit/s to 100 Gbit/s, and even to 400 Gbit/s. However, various effects in the optical fiber transmission system such as a nonlinear effect, a polarization mode dispersion (PMD) effect, and a differential coding cost have severely limited a transmission distance of the high-speed optical fiber transmission system. It is well known that, action processes of these damage effects may be described by using trellis diagrams, and therefore, these damage effects may be compensated for to some extent by using a BCJR (Bahl, Cocke, Jelinek, and Raviv) compensation algorithm, a forward and backward recursive operation algorithm.

To further compensate for the limit on the transmission distance of the high-speed optical fiber transmission system from the effects in the optical fiber transmission system, it has been proposed that compensation is performed in a Turbo equalization manner at a receive end of the high-speed optical fiber transmission system, in other words, system performance is improved by means of interactive iteration between multiple soft information processing modules. For example, iteration is performed between a low density parity check (LDPC) decoder and a BCJR module, to compensate for the differential coding effect, the nonlinear effect, the PMD effect, and the like. Such a Turbo equalization manner can greatly improve the system performance by compensating for damage in a channel. Herein, one-bit soft information refers to a probability value of decision on whether this bit is 0 or 1. To simplify an operation, generally a ratio of a probability of decision that the bit is 0 to a probability of decision that the bit is 1 is used, and then the logarithm of the ratio is taken.

In addition, a Turbo equalizer implementing the foregoing Turbo equalization manner uses a feedback structure and an LDPC code word, and a BCJR module of the Turbo equalizer uses a common sliding window BCJR with a serial structure. Generally, a length of the LDPC code word used in optical communication reaches ten thousand bits, and the entire LDPC code word needs to be stored in the BCJR module. Therefore, the BCJR module may have numerous storage resources. However, the Turbo equalizer using the feedback structure, the LDPC code word of a large length, and the complex BCJR module all limit a system throughput.

It can be seen that, in an optical fiber transmission system with a high speed greater than 100 Gbit/s, to implement a high throughput greater than 100 Gbit/s, the foregoing Turbo equalization manner cannot adapt to large-capacity high-speed transmission.

SUMMARY

The embodiments of the present invention put forward a method for implementing Turbo equalization compensation and an equalizer, which are intended to solve a problem that a throughput is limited when Turbo equalization compensation is implemented in a high-speed optical fiber transmission system.

According to a first aspect, a method for implementing Turbo equalization compensation is put forward, including: dividing a first data block into n data segments, where D bits in two adjacent data segments in the n data segments overlap, n is a positive integer greater than or equal to 2, and D is a positive integer greater than or equal to 1, performing recursive processing on each data segment in the n data segments, after recursive processing, merging the n data segments to obtain a second data block; and performing iterative decoding on the second data block, to output a third data block, where data lengths of the first data block, the second data block, and the third data block are all 1/T of a code length of a low density parity check (LDPC) convolutional code, and T is a quantity of layers of a step-shaped check matrix of the LDPC convolutional code.

With reference to the first aspect, in a first implementation manner of the first aspect, the performing recursive processing on each data segment in the n data segments includes: performing a forward recursive operation on each data segment of the n data segments concurrently and performing a backward recursive operation on each data segment of the n data segments concurrently.

With reference to the first aspect, in a second implementation manner of the first aspect, the performing recursive processing on each data segment in the n data segments includes: performing a forward recursive operation on each data segment of the n data segments concurrently.

With reference to the first aspect, in a third implementation manner of the first aspect, the performing recursive processing on each data segment in the n data segments includes: performing a backward recursive operation on each data segment of the n data segments concurrently.

With reference to the first aspect or the first, second, and third implementation manners of the first aspect, in a fourth implementation manner of the first aspect, the performing recursive processing on each data segment in the n data segments includes: receiving the second data block; performing decoding processing on the received second data block and other T−1 data blocks on which the iterative decoding has been performed, where a data length of each of the other T−1 data blocks on which the iterative decoding has been performed is 1/T of the code length of the LDPC convolutional code; and outputting the third data block on which the decoding processing has been performed for a maximum quantity of times.

With reference to the first aspect or the first, second, third, and fourth implementation manners, in a fifth implementation manner of the first aspect, before the dividing a first data block into n data segments, the method further includes: performing conditional transition probability distribution estimation on the first data block, to determine channel estimation parameter information.

According to a second aspect, a Turbo equalizer is put forward, including:

a processor; and a computer readable medium having a plurality of computer executable instructions that, when executed by the processor, cause the processor to perform the following steps:

dividing a first data block into n data segments, wherein D bits in two adjacent data segments in the n data segments overlap, n is a positive integer greater than or equal to 2, and D is a positive integer greater than or equal to 1, performing recursive processing on each data segment in the n data segments, after recursive processing, merging the n data segments to obtain a second data block; and performing iterative decoding on the second data block, to output a third data block, wherein data lengths of the first data block, the second data block, and the third data block are all 1/T of a code length of a low density parity check (LDPC) convolutional code, and T is a quantity of layers of a step-shaped check matrix of the LDPC convolutional code.

With reference to the second aspect, in a first implementation manner of the second aspect, the step of performing recursive processing on each data segment in the n data segments comprises: performing a forward recursive operation on each data segment of the n data segments concurrently and performing a backward recursive operation on each data segment of the n data segments concurrently.

With reference to the second aspect, in a second implementation manner of the second aspect, the step of performing recursive processing on each data segment in the n data segments comprises: performing a forward recursive operation on each data segment of the n data segments concurrently.

With reference to the second aspect, in a third implementation manner of the second aspect, the step of performing recursive processing on each data segment in the n data segments comprises: performing a backward recursive operation on each data segment of the n data segments concurrently.

With reference to the second aspect or the first, second, and third implementation manners of the second aspect, in a fourth implementation manner of the second aspect, the step of performing iterative decoding on the second data block, to output a third data block comprises: receiving the second data block; performing decoding processing on the received second data block and other T−1 data blocks on which the iterative decoding has been performed, where a data length of each of the other T−1 data blocks on which the iterative decoding has been performed is 1/T of the code length of the LDPC convolutional code; outputting the third data block on which the decoding processing has been performed for a maximum quantity of times.

With reference to the second aspect or the first, second, third and fourth implementation manners of the second aspect, in a fifth implementation manner of the second aspect, the method further includes: before the dividing the first data block into the n data segments, performing conditional transition probability distribution estimation on the first data block, to determine channel estimation parameter information.

The embodiments of the present application are applied to a receive end of a high-speed optical fiber transmission system. By performing segmentation processing and forward and backward recursive operations on a received data block, and after that, performing Turbo iterative processing on the data block, a system throughput can be effectively improved.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

Figure 1:
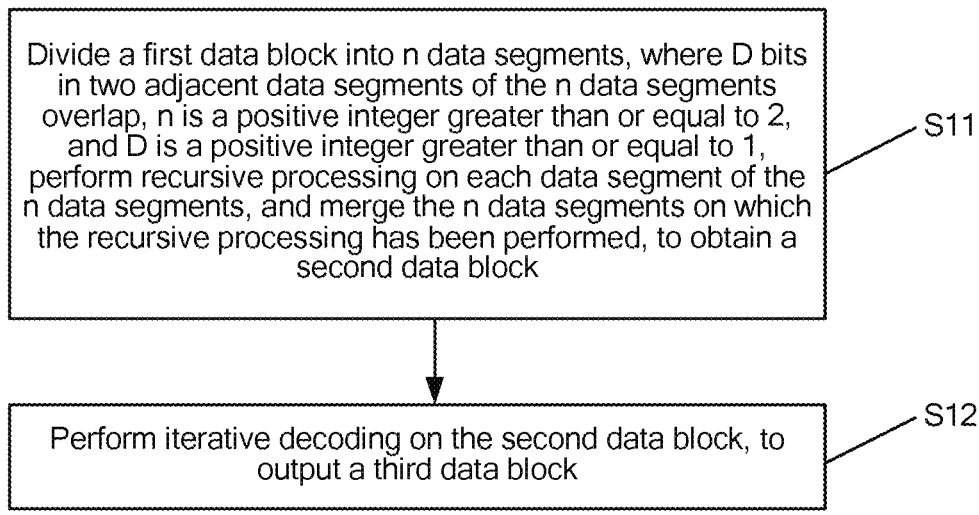
FIG. 1 is a flowchart of a Turbo equalization compensation method according to an embodiment of the present invention.

The following clearly describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

The technical solutions of the present invention may be applied to various communications systems, such as: a Global System for Mobile Communications (GSM) system, a Code Division Multiple Access (CDMA) system, a Wideband Code Division Multiple Access (WCDMA) system, a general packet radio service (GPRS) system, and a Long Term Evolution (LTE) system.

A user equipment (UE) may also be referred to as a mobile terminal or mobile station and may communicate with one or more core networks by using a radio access network (RAN). The UE exchanges voice and/or data with the radio access network.

A base station may be a base station (BTS) in the GSM or CDMA, may also be a base station (NodeB) in the WCDMA, and may further be an evolved NodeB (eNB or e-NodeB) in the LTE. In addition, one base station may support/manage one or more cells; when needing to communicate with a network, the UE selects a cell to initiate network access.

To resolve a problem that a throughput is limited when Turbo equalization compensation is implemented in a high-speed optical fiber transmission system, the embodiments of the present invention put forward a method for implementing Turbo equalization compensation that is applied to a receive end of the high-speed optical fiber transmission system.

For example, for a transmit end, after a sent signal passes through a framer (framer) in an optical transport unit (OTU), the sent signal successively undergoes convolutional code coding in an LDPC convolutional code encoder, and differential coding in a differential encoder, and finally an optical signal is sent by an optical modulator to an optical fiber transmission network. For a receive end, after coherent check, analog to digital converter (ADC) sampling, and normal equalization processing are performed on an optical signal, the optical signal enters a Turbo equalizer system to implement Turbo equalization compensation, and finally forms a received signal after passing through a deframer in the OTU.

In the embodiments of the present invention, the Turbo equalizer system may include at least one Turbo equalizer, for example, each Turbo equalizer includes an OP-BCJR unit and an LDPC convolutional code decoding unit. In addition, the Turbo equalizer system may further include at least one independent LDPC convolutional code decoding unit.

The following describes, by using an example in which the Turbo equalizer system includes one Turbo equalizer, the method for implementing Turbo equalization compensation according to an embodiment of the present invention. Refer to the following steps.

S11: An OP-BCJR unit in a Turbo equalizer divides a first data block into n data segments, where D bits in two adjacent data segments in the n data segments overlap, n is a positive integer greater than or equal to 2, and D is a positive integer greater than or equal to 1, performs recursive processing on each data segment in the n data segments, and merges the n data segments on which the recursive processing has been performed, to obtain a second data block.

Herein, a data length of each of the first data block and the second data block are both 1/T of a code length of an LDPC convolutional code, and T is a quantity of layers of a step-shaped check matrix of the LDPC convolutional code. In addition, a state value of a start symbol of the overlapped D bits is of equiprobability distribution. The equiprobability distribution refers to that a probability of state distribution at this bit is equal in each possible state.

Herein, the code length of the LDPC convolutional code refers to a data length that meets a layer check relationship. Herein, the "meeting a layer check relationship" refers to that $x*H_i^t=0$ and i=1, 2, ..., and T, where x is hard decision bit data that meets the relationship, and $H_i^t$ is a transposition of the $i^{th}$ layer $H_i$ of a check matrix of the LDPC convolutional code. Herein, $H_1$ to $H_T$ constitute the check matrix of the LDPC convolutional code.

In other words, T indicates that a total of T code word blocks are combined to jointly meet the check relationship of the LDPC convolutional code. T is determined by a step-shaped structure parameter (namely, the quantity of layers) of the check matrix H of the LDPC convolutional code. For example, assuming that a quantity of columns staggered from each other between the $i^{th}$ layer $H_i$ and the $(i+1)^{th}$ layer $H_{i+1}$ of the check matrix of the LDPC convolutional code is $N_T$, and a quantity of columns on each layer of the check matrix of the LDPC convolutional code is N, where generally $N_T$ and N are constants, then $T=N/N_T$.

It can be seen that, a data length of a data block processed in the Turbo equalizer is only 1/T of the code length of the LDPC convolutional code, and therefore storage resources needed by the OP-BCJR unit can be reduced.

Further, the performing recursive processing on each data segment in the n data segments may include: performing a forward recursive operation and a backward recursive operation on each data segment of the n data segments concurrently. The performing recursive processing on each data segment in the n data segments may also include: performing a forward recursive operation on each data segment of the n data segments concurrently. The performing recursive processing on each data segment in the n data segments may also include: performing a backward recursive operation on each data segment of the n data segments concurrently. Optionally, the performing recursive processing on each data segment in the n data segments may include: performing a forward recursive operation on some data segments in the n data segments, and performing a backward recursive operation on remaining data segments.

In addition, when the OP-BCJR unit performs a forward recursive operation and a backward recursive operation, a probability density function (PDF), a probability distribution parameter, and a transition probability parameter of a channel need to be used. In some scenarios, these parameters are known in advance, but in some application scenarios, these parameters can only be obtained through channel estimation. Therefore, before the first data block is divided into the n data segments, conditional transition probability distribution estimation further needs to be performed on the first data block, to determine channel estimation parameter information.

S12: An LDPC convolutional code decoding unit in the Turbo equalizer performs iterative decoding on the second data block, to output a third data block. Herein, a data length of the third data block is also 1/T of the code length of the LDPC convolutional code.

A data length of a data block in Turbo equalization processing is always 1/T of the code length of the LDPC convolutional code, and therefore, a system throughput can be effectively improved.

Specifically, the performing iterative decoding on the second data block, to output a third data block includes: receiving the second data block; performing decoding processing on the received second data block and other T−1 data blocks on which the iterative decoding has been performed; and outputting the third data block on which the decoding processing has been performed for a maximum quantity of times. Herein, a data length of each of the other T−1 data blocks on which the iterative decoding has been performed is 1/T of the code length of the LDPC convolutional code.

It can be known from the above that, this embodiment of the present invention is applied to a receive end of a high-speed optical fiber transmission system. By performing, in an OP-BCJR unit, segmentation processing and forward and backward recursive operations on a received data block, and performing, in an LDPC convolutional code decoding unit, Turbo iterative processing on data obtained from the OP-BCJR unit, a system throughput can be effectively improved.

Figure 2:
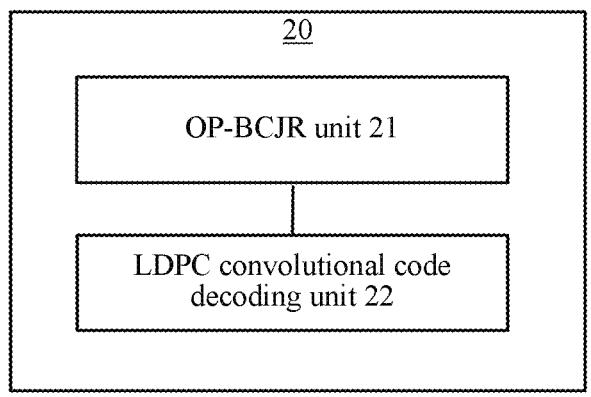
FIG. 2 is a schematic structural diagram of a Turbo equalizer according to an embodiment of the present invention.

FIG. 2 shows a schematic structural diagram of a Turbo equalizer for implementing Turbo equalization compensation according to an embodiment of the present invention. With reference to the Turbo equalizer in FIG. 2, the following describes in detail how to implement the Turbo equalization compensation method described above.

In FIG. 2, a Turbo equalizer 20 includes an OP-BCJR unit 21 and an LDPC convolutional code decoding unit 22, where:

the OP-BCJR unit 21 is configured to divide a first data block into n data segments, where D bits in two adjacent data segments in the n data segments overlap, n is a positive integer greater than or equal to 2, and D is a positive integer greater than or equal to 1, perform recursive processing on each data segment in the n data segments, and merge the n data segments on which the recursive processing has been performed, to obtain a second data block; and the LDPC convolutional code decoding unit 22 is connected to the OP-BCJR unit 21, and configured to perform iterative decoding on the second data block, to output a third data block.

In the foregoing, data lengths of the first data block, the second data block, and the third data block are all 1/T of a code length of a low density parity check LDPC convolutional code, and T is a quantity of layers of a step-shaped check matrix of the LDPC convolutional code.

Figure 3:
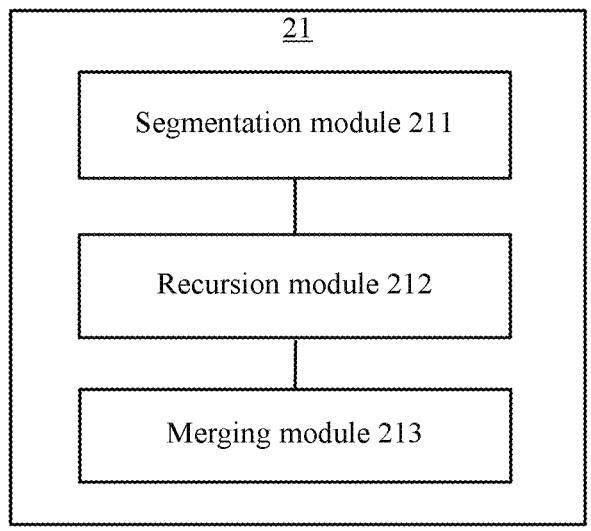
FIG. 3 is a schematic structural diagram of an overlapped parallel BCJR (OP-BCJR) unit in a Turbo equalizer according to an embodiment of the present invention.

Further, as shown in FIG. 3, the OP-BCJR unit 21 may include a segmentation module 211, a recursion module 212, and a merging module 213, where:

the segmentation module 211 is configured to divide the first data block into the n data segments, where D bits in two adjacent data segments in the n data segments overlap, n is a positive integer greater than or equal to 2, and D is a positive integer greater than or equal to 1;

the recursion module 212 is configured to perform the recursive processing on each data segment in the n data segments; and the merging module 213 is configured to merge the n data segments on which the recursive processing has been performed, to obtain the second data block.

Specifically, the recursion module 212 is configured to perform a forward recursive operation and a backward recursive operation on each data segment of the n data segments concurrently; or, perform a forward recursive operation on each data segment of the n data segments concurrently; or perform a backward recursive operation on each data segment of the n data segments concurrently. Optionally, the recursion module 212 may be further configured to perform a forward recursive operation on some data segments in the n data segments, and perform a backward recursive operation on remaining data segments.

Figure 4:
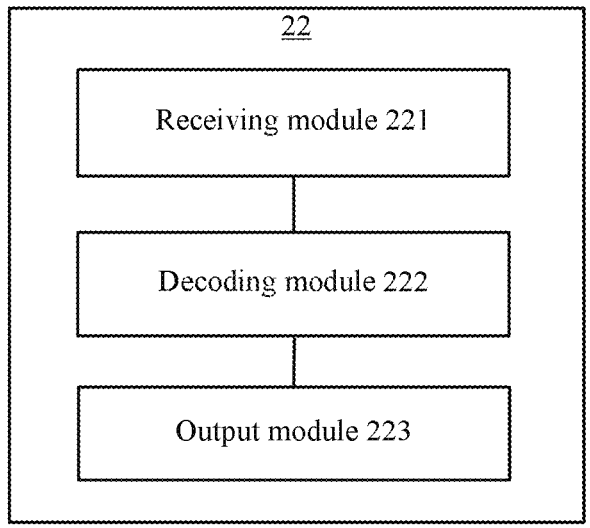
FIG. 4 is a schematic structural diagram of an LDPC convolutional code decoding unit in a Turbo equalizer according to an embodiment of the present invention.

Further, as shown in FIG. 4, the LDPC convolutional code decoding unit 22 may include a receiving module 221, a decoding module 222, and an output module 223, where:

the receiving module 221 is configured to receive the second data block;

the decoding module 222 is configured to perform decoding processing on the received second data block and other T−1 data blocks on which the iterative decoding has been performed, where a data length of each of the other T−1 data blocks on which the iterative decoding has been performed is 1/T of the code length of the LDPC convolutional code; and the output module 223 is configured to output the third data block on which the decoding processing has been performed for a maximum quantity of times.

It can be known from the above that, this embodiment of the present invention is applied to a receive end of a high-speed optical fiber transmission system. By performing, in an OP-BCJR unit, segmentation processing and forward and backward recursive operations on a received data block, and performing, in an LDPC convolutional code decoding unit, Turbo iterative processing on data obtained from the OP-BCJR unit, a system throughput can be effectively improved.

Figure 5:
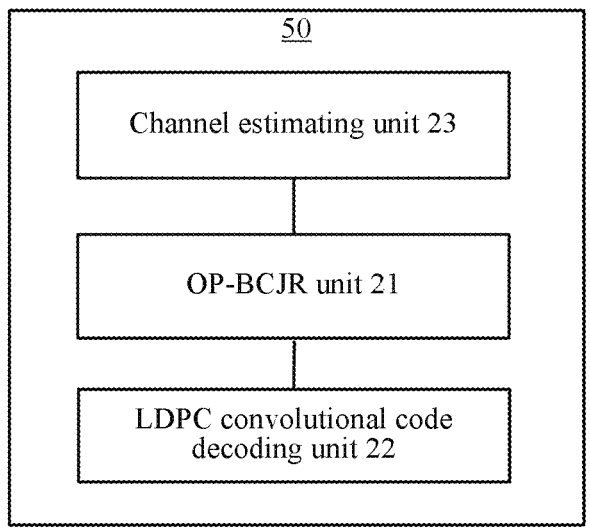
FIG. 5 is a schematic structural diagram of a Turbo equalizer according to another embodiment of the present invention.

In addition to an OP-BCJR unit 21 and an LDPC convolutional code decoding unit 22, an Turbo equalizer 50 shown in FIG. 5 further includes a channel estimating unit 23, where the channel estimating unit 23 is configured to: before the OP-BCJR unit divides a first data block into n data segments, perform conditional transition probability distribution estimation on the first data block, to determine channel estimation parameter information.

In this way, when performing a forward and/or backward recursive operation, the OP-BCJR unit needs to use a PDF probability distribution parameter, a transition probability parameter, and the like of a channel, which may be obtained through channel estimation.

In the foregoing embodiments, description is all provided by using one Turbo equalizer in the Turbo equalizer system as an example. In fact, to make an effect of Turbo equalization compensation better, it is generally considered that, the Turbo equalizer system may include at least one Turbo equalizer described above. Alternatively, the Turbo equalizer system may include at least one Turbo equalizer described above, and at least one LDPC convolutional code decoding unit described above, where relative positions of the Turbo equalizer and the LDPC convolutional code decoding unit may randomly change, and are not limited. Therefore, multi-level BCJR and LDPC convolutional code decoding processing may be performed in turn on data blocks whose data length is 1/T of the code length of the convolutional code; and because the OP-BCJR unit and the LDPC convolutional code decoding unit are connected in serial, Turbo equalization iterative processing will be performed on the data blocks.

Figure 6:
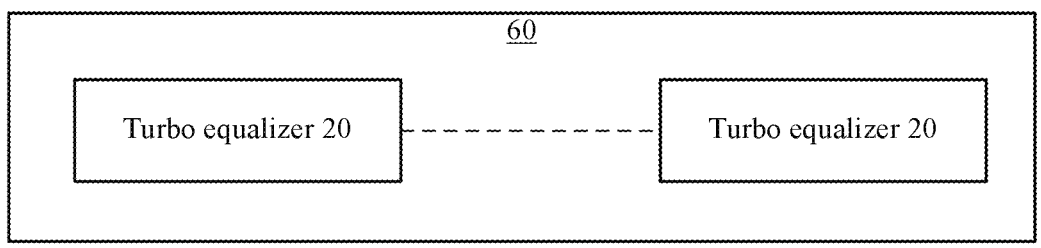
FIG. 6 is a schematic structural diagram of a Turbo equalizer system according to an embodiment of the present invention.

A Turbo equalizer system 60 shown in FIG. 6 includes at least one Turbo equalizer 20 shown in FIG. 2.

Figure 7:
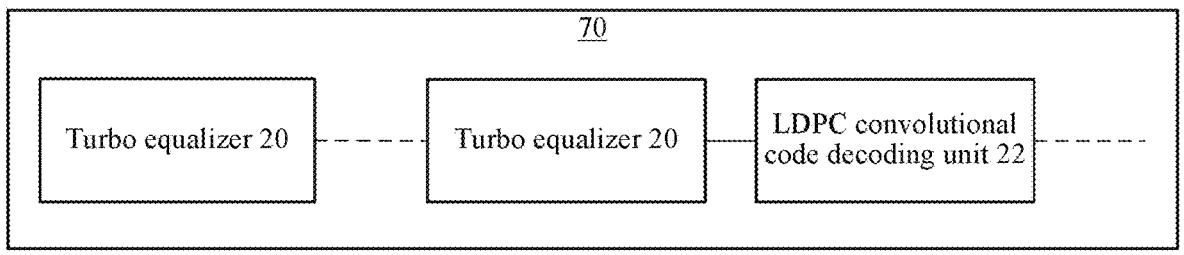
FIG. 7 is a schematic structural diagram of a Turbo equalizer system according to another embodiment of the present invention.

A Turbo equalizer system 70 shown in FIG. 7 includes at least one Turbo equalizer 20 shown in FIG. 2, and at least one LDPC convolutional code decoding unit 22. One LDPC convolutional code decoding unit in the at least one LDPC convolutional code decoding unit receives the third data block output by a Turbo equalizer in the at least one Turbo equalizer or another LDPC convolutional code decoding unit in the at least one LDPC convolutional code decoding unit, and performs iterative decoding on the third data block, to output a fourth data block, where a data length of the fourth data block is 1/T of the code length of the LDPC convolutional code.

For example, as shown in a schematic structural diagram of the Turbo equalizer system in FIG. 7, multiple Turbo equalizers 20 are connected, which then are further connected to one or more LDPC convolutional code decoding units 22. In other words, a third data block output by a first Turbo equalizer 20 is provided to a second Turbo equalizer 20, and used as a first data block of the second Turbo equalizer, a third data block output by the second Turbo equalizer 20 is provided to a third Turbo equalizer 20, and used as a first data block of the third Turbo equalizer, and so on. Therefore, a third data block output by a last Turbo equalizer 20 is provided to a first LDPC convolutional code decoding unit 22, and used as a second data block for the first LDPC convolutional code decoding unit 22 to perform iterative decoding, so as to output a third data block after the iterative decoding, a third data block output by the first LDPC convolutional code decoding unit 22 is used as a second data block for a second LDPC convolutional code decoding unit 22 to perform iterative decoding, so as to output a third data block after the iterative decoding, and so on.

Optionally, the Turbo equalizer 20 and the LDPC convolutional code decoding unit 22 in the Turbo equalizer system may also be connected to each other in an interspersed manner. It can be known from the above that, an output of a previous processing module (the Turbo equalizer 20 or the LDPC convolutional code decoding unit 22) is used as an input of a subsequent processing module (the Turbo equalizer 20 or the LDPC convolutional code decoding unit 22), and iteration is performed in turn.

Figure 8:
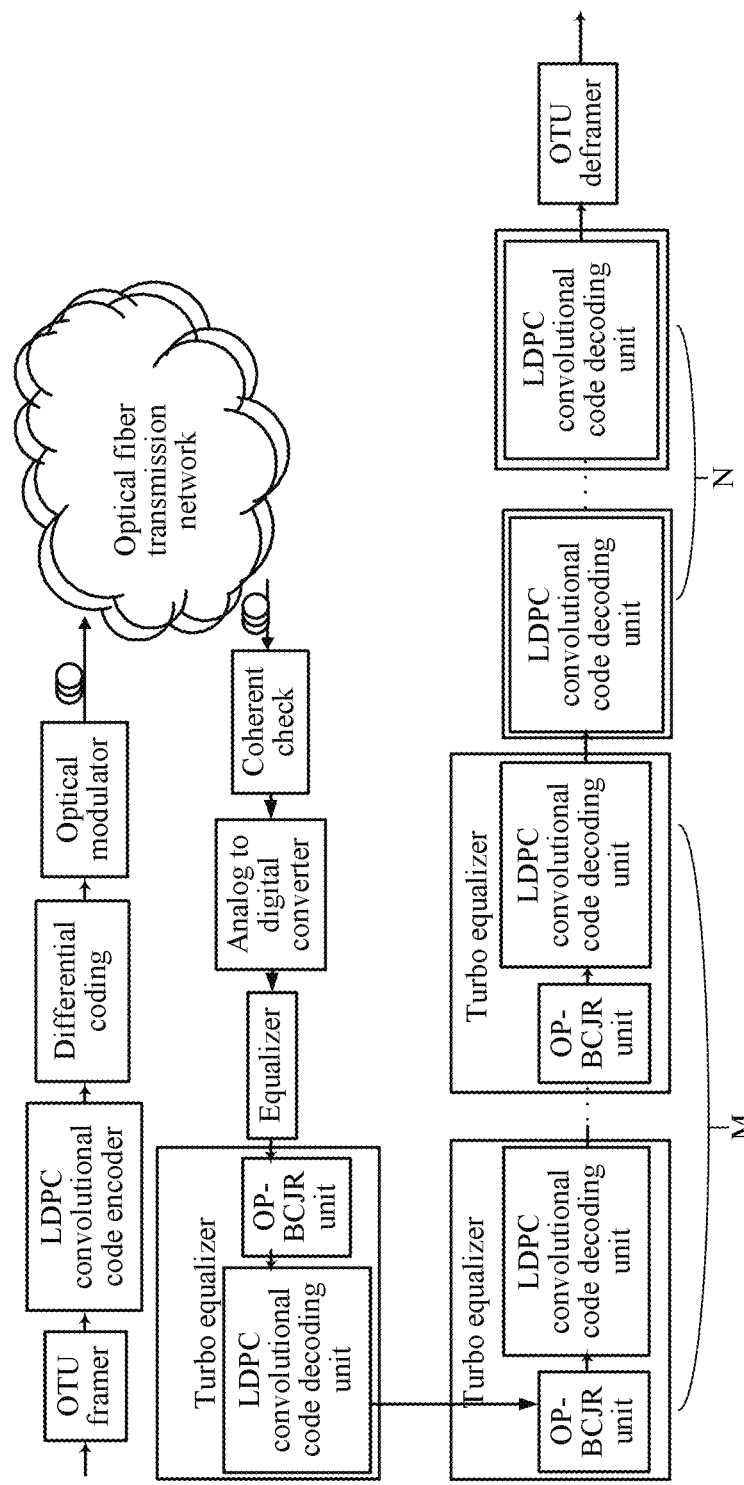
FIG. 8 is a structural diagram of a Turbo equalizer system according to a specific embodiment of the present invention.

With reference to FIG. 8, the following describes in detail an operating principle of a Turbo equalizer system.

As shown in FIG. 8, at a transmit end, coding is performed by using an LDPC convolutional code encoder, then differential coding is performed, and then an optical modulator sends an optical signal to an optical fiber transmission network; and at a receive end, after a coherent check, analog to digital converter sampling, and normal signal equalization processing using an equalizer, the optical signal enters the Turbo equalizer system.

The Turbo equalizer system includes: a primary Turbo equalizer (namely, a Turbo equalizer connected to a common signal equalizer) and M subsequent Turbo equalizers, where a difference between the primary Turbo equalizer and the subsequent Turbo equalizers lies in that, manners of setting a state value of a start symbol during an operation of an OP-BCJR unit are different. For example, a state value of a start symbol of an OP-BCJR unit in the primary Turbo equalizer is an equiprobability distribution state value, and a state value of a start symbol of an OP-BCJR unit in the subsequent Turbo equalizers is a state value at a same bit that is obtained from an operation of a previous-level OP-BCJR unit and read from a memory. The primary Turbo equalizer and the subsequent Turbo equalizers both include one OP-BCJR unit and one LDPC convolutional code decoding unit, as shown in FIG. 9.

In addition, the Turbo equalizer system shown in FIG. 8 further includes N independent LDPC convolutional code decoding units. It may be understood that, positions of the M subsequent Turbo equalizers and the N LDPC convolutional code decoding units in the Turbo equalizer system are not limited to those shown in FIG. 8, and a connection in an interspersed manner may also be used.

Figure 9:
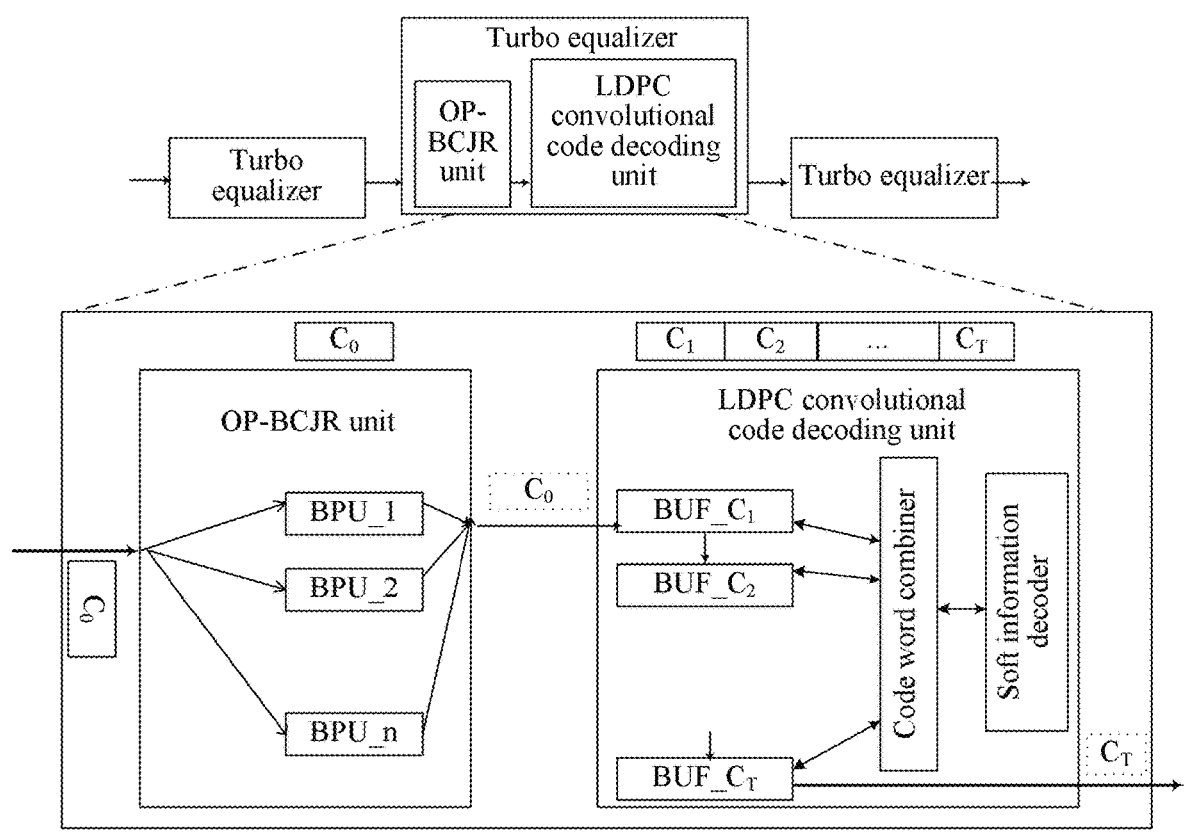
FIG. 9 is a structural diagram of a Turbo equalizer according to a specific embodiment of the present invention.
Figure 10:
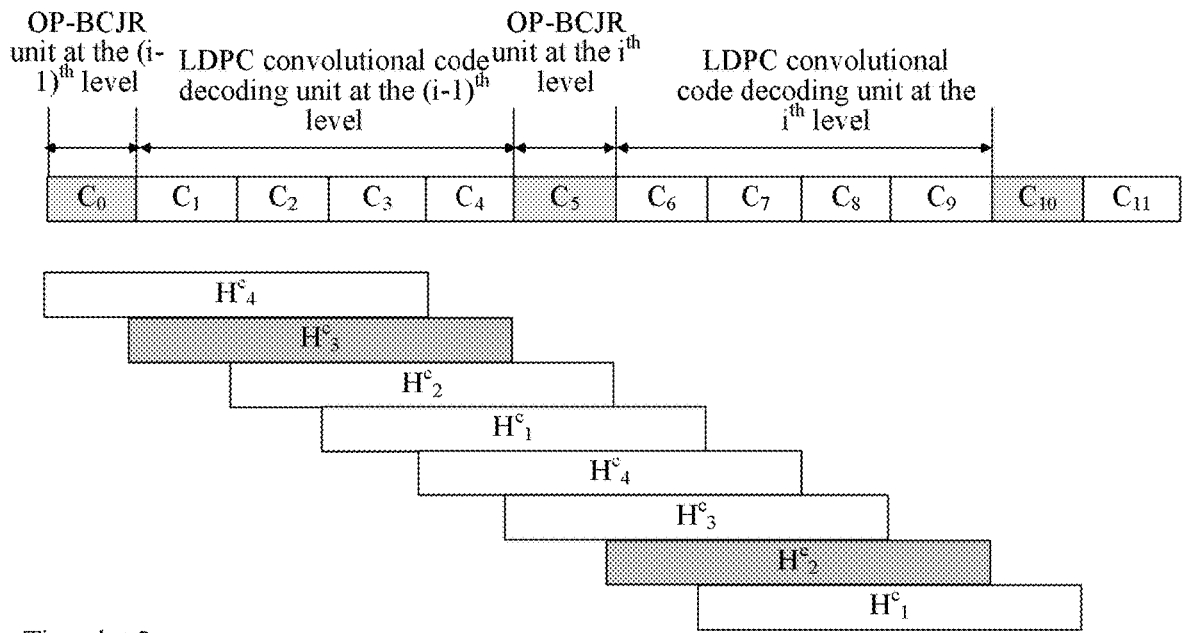
FIG. 10 is a schematic diagram of a timeslot of iterative processing of an OP-BCJR unit in a Turbo equalizer according to a specific embodiment of the present invention.
Figure 10:
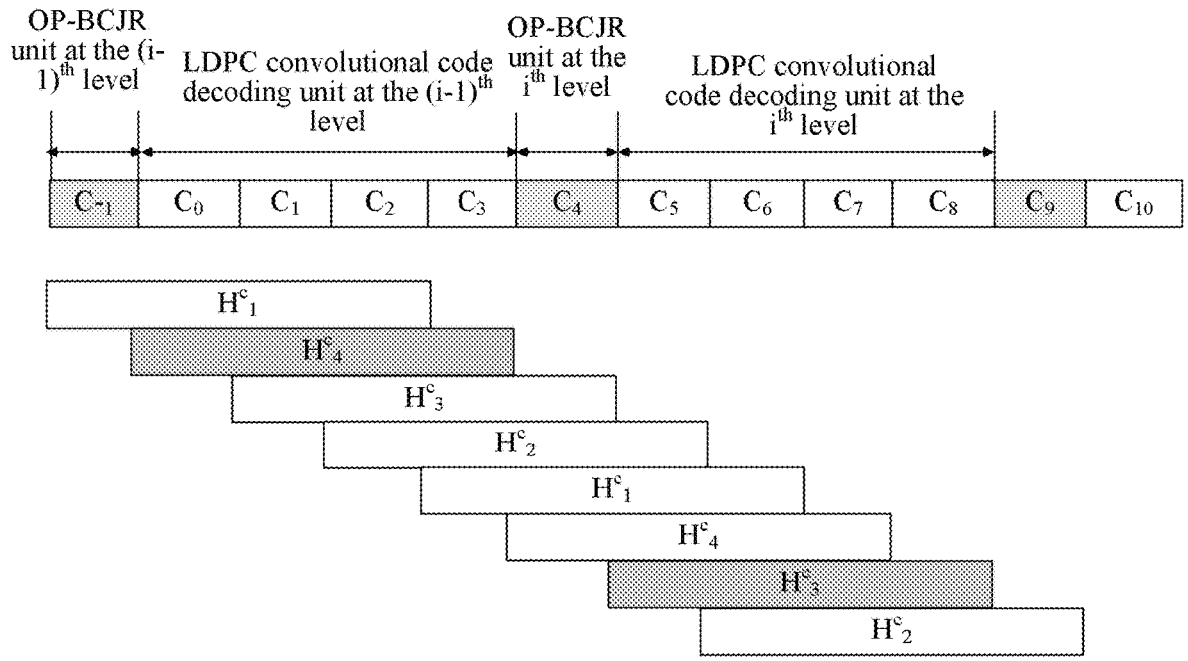
Figure 11:
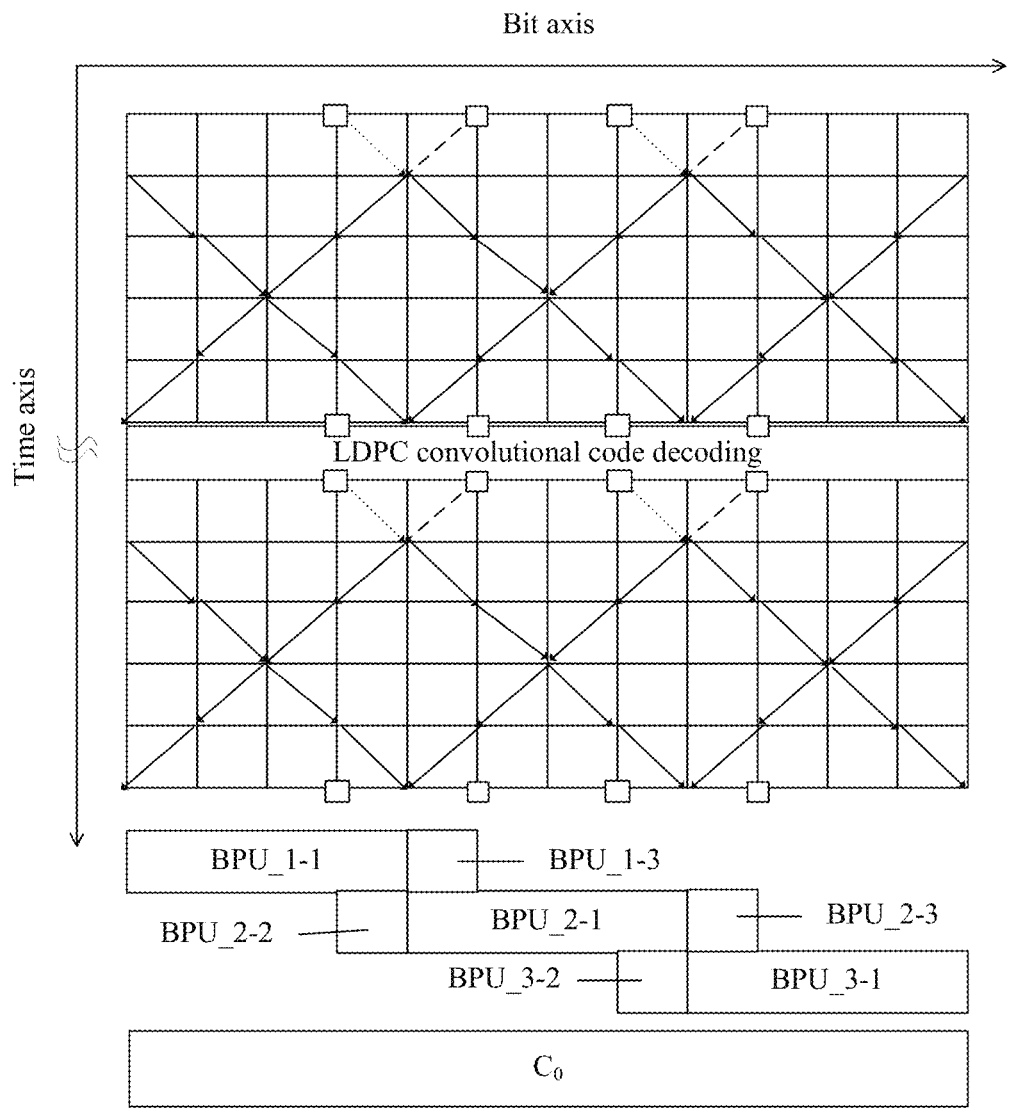
FIG. 11 is a schematic diagram of a specific processing process of an OP-BCJR unit in a Turbo equalizer according to a specific embodiment of the present invention.

FIG. 9 to FIG. 11 jointly describe an operating principle of a Turbo equalizer.

As shown in FIG. 9, in an LDPC convolutional code decoding unit, $C_1, C_2, C_3, \ldots,$ and $C_T$ jointly form a code word sequence that needs to meet a check relationship of the $k^{th}$ layer of a check matrix of an LDPC convolutional code, and decoding and soft information calculation are performed according to the check relationship of the layer. Meanwhile, an OP-BCJR unit divides a received data block $C_0$ into segments according to a state bit in a trellis diagram. D bits in adjacent segments overlap, n overlapped data segments are respectively sent to n segment processing units (such as BPU_1 to BPU_n) for BCJR operation processing (which includes a forward recursive operation and/or a backward recursive operation; for details, refer to FIG. 11 and relevant description).

After completing updating soft information of $C_1$, $C_2$, $C_3, \ldots,$ and $C_T$, the LDPC convolutional code decoding unit outputs the data block $C_T$ to a next-level Turbo equalizer. Meanwhile, the data block $C_0$ that has been processed is received from an OP-BCJR unit at a same level, $C_0$ and $C_1$, $C_2, C_3, \ldots,$ and $C_{T-1}$ that are still in the LDPC convolutional code encoder unit jointly form a code word sequence that needs to meet a check relationship of a layer that is one layer higher than the $k^{th}$ layer of the check matrix of the LDPC convolutional code, and decoding and soft information calculation are performed according to the check relationship of the layer.

The foregoing Turbo iterative processing process is represented by using a sequence diagram, as shown in FIG. 10, and an example in which T=4 is used.

At a first moment, in an LDPC convolutional code decoding unit of a Turbo module at the $(i-1)^{th}$ level, $C_1$, $C_2$, $C_3$, and $C_4$ jointly form a code word sequence that needs to meet a check relationship of an $H^c_3{}^{th}$ layer of a check matrix Hc of an LDPC convolutional code, and decoding and soft information calculation are performed according to the check relationship of the layer. Meanwhile, an OP-BCJR unit that is also at the $(i-1)^{th}$ level performs BCJR parallel operation processing on a received data block $C_0$ according to overlapped segments.

At a second moment, the LDPC convolutional code decoding unit at the $(i-1)^{th}$ level outputs the data block $C_4$ to a Turbo equalizer at the $i^{th}$ level. Meanwhile, the data block $C_0$ that has been processed is received from the OP-BCJR unit at the same level, $C_0$ and $C_1$, $C_2$, and $C_3$ that are still in the LDPC convolutional code encoder unit jointly form a code word sequence that needs to meet a check relationship of an $H^c_4$ layer of the check matrix Hc of an LDPC convolutional code, and decoding and soft information calculation are performed according to the check relationship of the layer.

A specific processing process of the overlapped parallel OP-BCJR unit is shown in FIG. 11. The data block $C_0$ is divided into multiple segments in advance, where the segments overlap with each other, and BPU modules are responsible for processing information update of the segments, for example, BPU_1, BPU_2, and BPU_3 that are marked at the lower part of FIG. 11. Bit segments for which each BPU module is responsible and posterior soft information really needs to be updated are a first part in BPU_1, BPU_2, and BPU_3 modules, respectively being BPU_1-1, BPU_2-1, and BPU_3-1; and overlapped parts for which only a state value needs to be updated by using a state value obtained in previous iteration by an adjacent segment are a second part (a state value of a start symbol shown in this part is a forward state value obtained in the previous iteration by a previous segment) and a third part (a state value of a start symbol shown in this part is a backward state value obtained in the previous iteration by a next segment) in the BPU_1, BPU_2, and BPU_3 modules, respectively being BPU_1-2, BPU_2-2, and BPU_3-2, and BPU_1-3, BPU_2-3, and BPU_3-3.

A processing process of an OP-BCJR unit is as follows: (1) in each BPU module, from a memory, a forward state value of a start symbol (a small blank box on a bit axis) of a bit segment (a second part) that overlaps with a previous segment is read, and a backward state value of a start symbol (a small solid box on the bit axis) of a bit segment (a third part) that overlaps with a next segment is read, where for an OP-BCJR unit in the primary Turbo equalizer, a state value corresponding to a start symbol is an equiprobability distribution state value; (2) each BPU module performs an overlapped forward recursive operation (a dotted line in the figure) on an overlapped bit segment of the second part, until an end bit of the bit segment of the second part, and performs an overlapped backward recursive operation (a dashed line in the figure) on an overlapped bit segment of the third part, until an end bit of the bit segment of the third part; (3) using the end bits of the bit segments of the second part and the third part as start symbols, each BPU module performs a forward recursive operation and a backward recursive operation on a bit segment of a first part that each BPU module is really responsible for updating, and calculates posterior soft information of each bit according to obtained forward and backward state values; and (4) each BPU module needs to store the forward and backward state values of the start symbols of the second part and the third part that overlap with an adjacent bit segment, to be used in an operation of a next-level OP-BCJR unit.

With the embodiment in FIG. 11, the foregoing describes a process of performing forward recursive processing and backward recursive processing on each data segment (that is, BPU module). It should be understood that, to simplify recursive processing, it may also be that only the forward recursive processing or the backward recursive processing is performed on each data segment (namely, BPU module); or the forward recursive processing is performed on some data segments, and the backward recursive processing is performed on the other data segments.

Therefore, in this embodiment, by performing, in an OP-BCJR unit, segmentation processing and forward and backward recursive operations on a received data block, and performing, in an LDPC convolutional code decoding unit, Turbo iterative processing on data obtained from the OP-BCJR unit, a throughput of Turbo equalization compensation is effectively improved and needed storage resources are reduced.

Figure 12:
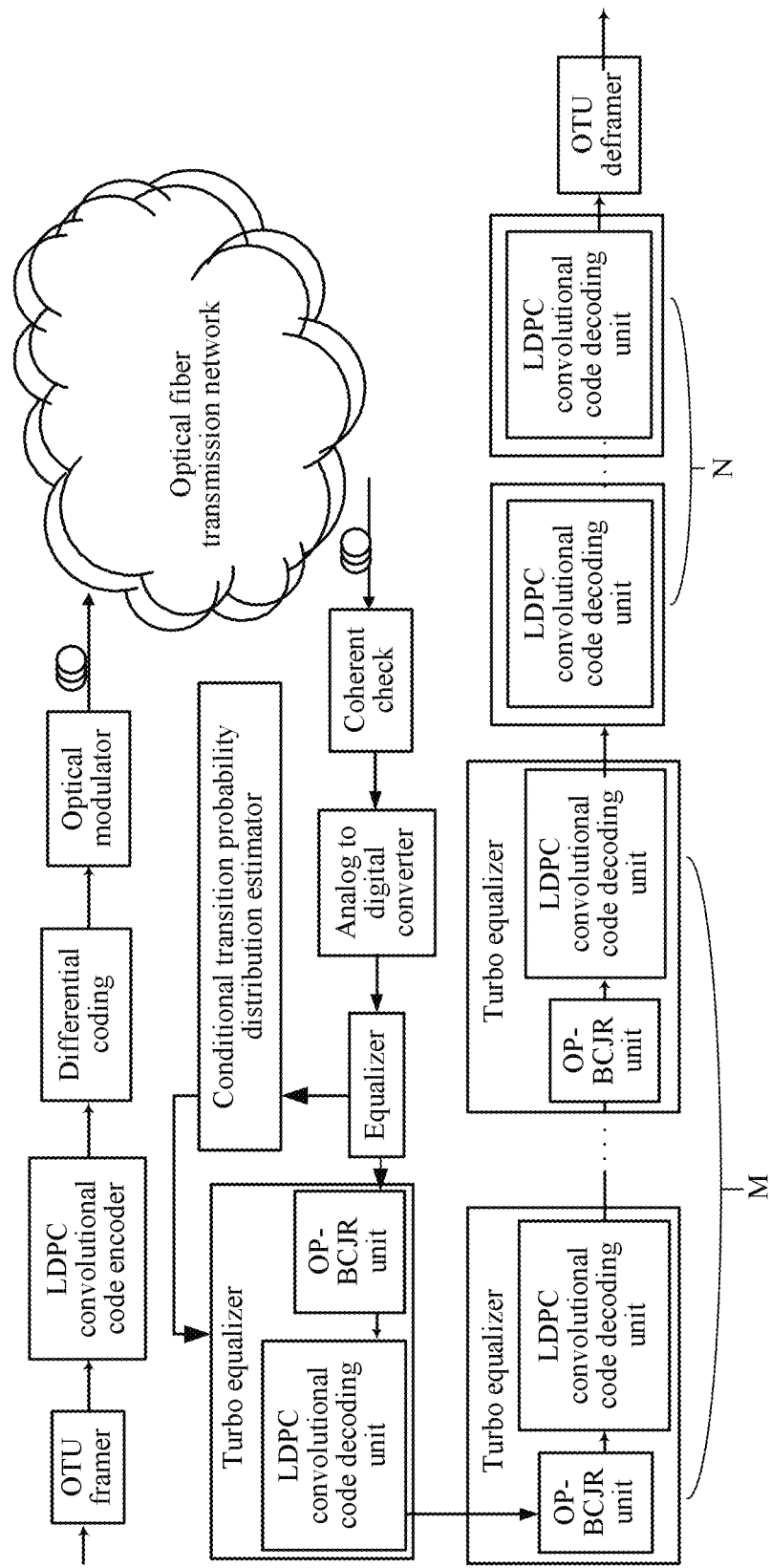
FIG. 12 is a structural diagram of a Turbo equalizer system according to another specific embodiment of the present invention.

FIG. 12 shows another specific embodiment of a Turbo equalizer system according to an embodiment of the present invention. An output signal of an equalizer in the prior art needs to pass through a channel estimating unit (which is a conditional transition probability distribution estimator in FIG. 12), to enter a primary Turbo equalizer only after a channel estimation parameter (such as, a PDF probability distribution parameter, a transition probability parameter, and the like of a channel) is determined. Therefore, conditional transition probability distribution that needs to be used by an OP-BCJR unit in the primary Turbo equalizer needs to be estimated according to a training sequence in the system. In other words, damage caused in an optical fiber channel by a nonlinear effect and a PMD effect is compensated for.

Obviously, in this embodiment, by performing, in an OP-BCJR unit, segmentation processing and/or forward and backward recursive operations on a received data block, and performing, in an LDPC convolutional code decoding unit, Turbo iterative processing on data obtained from the OP-BCJR unit, a throughput of Turbo equalization compensation is effectively improved, needed storage resources are reduced, and damage caused in an optical fiber channel by a nonlinear effect and a PMD effect can be compensated for.

It should be understood that, a solution described in each claim of the present invention should also be regarded as an embodiment, and features in the claims may be combined, for example, different branch steps performed after determining steps in the present invention may be used as different embodiments.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein again.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes several instructions for instructing a computer device (which may be a personal computer, a server, or a network device) to perform all or some of the steps of the methods described in the embodiments of the present invention. The foregoing storage medium includes: any medium that can store program code, such as a USB flash drive, a removable hard disk, a read-only memory (ROM), a random access memory (RAM), a magnetic disk, or an optical disc.

What is claimed is:

1. A method for implementing Turbo equalization compensation, comprising:
    receiving, by a coherent detector, an optical signal from an optical fiber channel;
    converting, by the coherent detector, the optical signal to analog electrical signal;
    converting, by an analog to digital converter, the analog electrical signal into digital electrical signal including a first data block;

dividing, by a turbo equalizer, the first data block into n data segments, wherein D bits in two adjacent data segments in the n data segments overlap, n is a positive integer greater than or equal to 2, and D is a positive integer greater than or equal to 1;

performing, by the turbo equalizer, recursive processing including performing a forward recursive operation and a backward recursive operation on each data segment of the n data segments concurrently;

after the recursive processing, merging, by the turbo equalizer, the n data segments to obtain a second data block; and performing, by the turbo equalizer, iterative decoding on the second data block, to output a third data block to compensate for damage caused in the optical fiber channel by a nonlinear effect and a polarization mode dispersion effect, wherein data lengths of the first data block, the second data block, and the third data block are all 1/T of a code length of a low density parity check (LDPC) convolutional code, and T is a quantity of layers of a step-shaped check matrix of the LDPC convolutional code.

2. The method according to claim 1, wherein the performing iterative decoding on the second data block, to output the third data block comprises:

receiving the second data block;

performing decoding processing on the received second data block and other T-1 data blocks on which the iterative decoding has been performed, wherein a data length of each of the other T-1 data blocks on which the iterative decoding has been performed is 1/T of the code length of the LDPC convolutional code; and outputting the third data block on which the decoding processing has been performed for a maximum quantity of times.

3. The method according to claim 1, wherein before the dividing the first data block into n data segments, the method further comprises:

performing conditional transition probability distribution estimation on the first data block, to determine channel estimation parameter information.

4. A Turbo equalizer, comprising:

a processor; and a non-transitory computer readable medium having a plurality of computer executable instructions that, when executed by the processor, cause the processor to perform:

dividing a first data block into n data segments, wherein D bits in two adjacent data segments in the n data segments overlap, n is a positive integer greater than or equal to 2, and D is a positive integer greater than or equal to 1;

performing recursive processing including performing a forward recursive operation and a backward recursive operation on each data segment of the n data segments concurrently;

after the recursive processing, merging the n data segments to obtain a second data block; and performing iterative decoding on the second data block, to output a third data block to compensate for damage caused in an optical fiber channel by a nonlinear effect and a polarization mode dispersion effect, wherein data lengths of the first data block, the second data block, and the third data block are all 1/T of a code length of a low density parity check (LDPC) convolutional code, and T is a quantity of layers of a step-shaped check matrix of the LDPC convolutional code.

5. The Turbo equalizer according to claim 4, wherein the performing iterative decoding on the second data block, to output the third data block comprises:

receiving the second data block;

performing decoding processing on the received second data block and other T-1 data blocks on which the iterative decoding has been performed, wherein a data length of each of the other T-1 data blocks on which the iterative decoding has been performed is 1/T of the code length of the LDPC convolutional code; and outputting the third data block on which the decoding processing has been performed for a maximum quantity of times.

6. The Turbo equalizer according to claim 4, further comprising:

before the dividing the first data block into the n data segments, performing conditional transition probability distribution estimation on the first data block, to determine channel estimation parameter information.

7. An optical fiber transmission system, comprising an optical transmitter and an optical receiver, wherein the optical transmitter includes an optical modulator, the optical receiver includes a coherent detector, an analog to digital converter, a processor, the optical transmitter connected to the optical receiver via an optical fiber;

the optical transmitter is configured to transmit an optical signal via the optical fiber, wherein the optical signal is converted from an electrical signal by the optical modulator;

the coherent detector is configured to receive the optical signal from the optical fiber and, convert the optical signal into an analog electrical signal;

the analog to digital converter is configured to convert the analog electrical signal into digital electrical signal including a first data block;

the processor is configured to divide the first data block into n data segments, perform recursive processing including performing a forward recursive operation and a backward recursive operation on each data segment of the n data segments concurrently, merge the n data segments to obtain a second data block, and perform iterative decoding on the second data block, to output a third data block to compensate for damage caused in an optical fiber channel in the optical fiber by a nonlinear effect and a polarization mode dispersion effect, wherein data lengths of the first data block, the second data block, and the third data block are all 1/T of a code length of a low density parity check (LDPC) convolutional code, and T is a quantity of layers of a step-shaped check matrix of the LDPC convolutional code.

* * * * *